United States Patent [19]

Nagai et al.

[11] Patent Number: 5,223,594

[45] Date of Patent: Jun. 29, 1993

[54] FLAME-RETARDANT RESIN COMPOSITION CONTAINING A BROMOSTYRENE PREPOLYMER

[75] Inventors: Akira Nagai, Hitachi; Junichi Katagiri, Naka; Masahiro Ono; Masao Suzuki, both of Hitachi; Akio Takahashi, Hitachioota; Toshikazu Narahara, Tokai, all of Japan

[73] Assignee: Hitachi, Ltd., Tokyo, Japan

[21] Appl. No.: 618,982

[22] Filed: Nov. 28, 1990

Related U.S. Application Data

[63] Continuation of Ser. No. 215,511, Jul. 6, 1988, abandoned.

[30] Foreign Application Priority Data

Jul. 8, 1987 [JP] Japan .................. 62-168600

[51] Int. Cl.$^5$ .................. C08F 214/16; C08F 212/00
[52] U.S. Cl. .................. 526/296; 260/DIG. 24
[58] Field of Search .................. 526/293, 296

[56] References Cited

U.S. PATENT DOCUMENTS 3,845,022  10/1974  Ray-Chaudhuri .................. 526/296

OTHER PUBLICATIONS

European Patent Application 0,202,488 Nov. 26, 1986.

*Primary Examiner*—Christopher Henderson
*Attorney, Agent, or Firm*—Antonelli, Terry, Stout & Kraus

[57] ABSTRACT

A flame-retardant resin composition contains a prepolymer represented by the general formula:

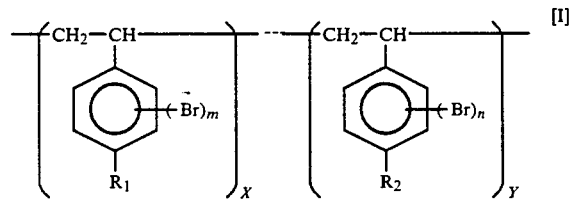

wherein $R_1$ stands for a hydrogen atom or an unreactive saturated group; $R_2$ stands for a reactive unsaturated group; m and n each stand for a positive number of 1 to 4 and X and Y are each a copolymerization ratio and are in the range of 0.3 to 0.7 with the proviso that the sum total of X and Y is 1, as an essential component. The flame retardant resin composition is curable with uniform crosslinking density and without substantial stress concentration and is suitable for producing a laminate for a multilayer printed wiring board having a high thermal impact resistance as well as excellent heat resistance and electrical characteristics.

4 Claims, No Drawings

FLAME-RETARDANT RESIN COMPOSITION CONTAINING A BROMOSTYRENE PREPOLYMER

This is a continuation of application Ser. No. 215,511, filed Jul. 6, 1988, now abandoned.

The present invention relates to a flame-retardant resin composition and a laminate manufactured therefrom. Particularly, it relates to a flame-retardant resin composition suitable for the production of a laminate for a multi-layer printed wiring board having excellent heat resistance and electrical characteristics as well as a low dielectric constant.

BACKGROUND OF THE INVENTION

Up to this time, an epoxy or polyimide resin has been used as a laminate material for a multi-layer printed wiring board over a long period of time. Recently, however, a multilayer printed wiring board excellent in electrical characteristics has been demanded, because a high speed processing operation of a large scale computer requires to increase signal transmission speed. Particularly, a laminate material of a low dielectric constant is required to reduce the delay time of signal transmission and the thickness of a circuit thereby to obtain a high signal transmission speed and a high density multilayer printed wiring board. A laminate material having a lower dielectric constant based on polybutadiene has been proposed as a placement for the epoxy and polyimide resins as disclosed in Japanese Patent Publication No. 58-21926(1983).

The above-mentioned polybutadiene resin exhibits a dielectric constant lower than that of the polyimide resin and therefore is suitable for the multilayer printed wiring board requiring a high speed signal transmission. However, it is problematic in that the polybutadiene exhibits a tackiness in prepregs, a low mechanical strength and an insufficient heat resistance. Further, the serious disadvantage of the polybutadiene is that it is a flammable resin.

For suppressing the flammability of the polybutadiene a low molecular weight flame retardant of a crosslinking type is added to the polybutadiene as disclosed in Japanese Patent Publication No. 59-19023(1984) partly corresponding to U.S. Pat. No. 4,268,433. However, this low molecular weight crosslinking type flame retardant has problems in that it generally affects the electrical characteristics of the resultant material adversely and that it lowers the thermal decomposition initiating temperature which is a criterion of heat resistance.

The use of a high-molecular weight flame retardant of a crosslinking type such as alkenyl ethers and alkenoyl esters of poly(p-hydroxybromostyrene) is proposed as disclosed in Japanese Patent Application Laid-Open No. 61-243844(1986) corresponding to U.S. Ser. No. 854,507 filed on Apr. 22, 1986 now U.S. Pat. No. 4,784,917. These retardants exhibit a relatively low dielectric constant and are excellent in heat resistance, so that the combination of such flame retardant with the polybutadiene prepolymer provides a laminate material suitable for the production of a multi-layer printed wiring board of a low dielectric constant. However, since all of the side chains of a poly(p-hydroxybromostyrene) derivative contains a reactive unsaturated group, such as an alkenyl or alkenoyl group, crosslinking reaction proceeds nonuniformly with respect to crosslinking point distance during crosslinking by heating so that stress concentration is caused during curing, and the resultant cured product tends to be caused cracking by heat shock or heat cycle, in that, during crosslinking reaction by heating the density of the reactive groups in the poly(p-hydroxybromostyrene) derivative prepolymer locally increases near crosslinking points due to polymer effect to cause crosslinking reaction concentration. Once the crosslinking proceeds to some extent, the mobility of the polymer lowers to suppress the crosslinking reaction, thus the distances between crosslinking points become nonuniform, in other words, the crosslink densities of the resultant cured product are rendered uneven. Such that the residual stress during curing reaction concentrates locally and is likely to cause the resultant cured product cracking by thermal impact such as heat shock or heat cycle.

SUMMARY OF THE INVENTION

One object of the present invention is to provide a flame retardant resin composition which is curable with uniform crosslinking density and without substantial stress concentration and is suitable for producing a laminate for a multilayer printed wiring board having a high thermal impact resistance as well as excellent heat resistance and electrical characteristics and a low dielectric constant.

Another object of the present invention is to provide a flame retarded laminate for a multilayer printed wiring board having a high thermal impact resistance as well as excellent heat resistance and electrical characteristics and a low dielectric constant.

The one aspect of the present invention is to provide a flame-retardant resin composition characterized by containing a prepolymer represented by the general formula:

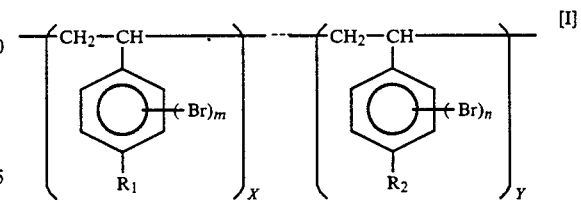

wherein $R_1$ stands for a hydrogen atom or an unreactive saturated group; $R_2$ stands for a reactive unsaturated group; m and n each stand for a positive number of 1 to 4 and X and Y are each a copolymerization ratio and are in the range of 0.3 to 0.7 with the proviso that the sum total of X and Y is 1, as an essential component.

Another aspect of the present invention is to provide a laminate obtained by laminating prepregs prepared by impregnating a base material or a substrate with a synthetic resin and drying the impregnated base material, characterized in that said synthetic resin is a flame-retardant resin composition containing the specified prepolymer as an essential component according to the one aspect of the present invention.

According to the present invention, the reactive groups in the prepolymer are uniformly dispersed by uniformly or randomly introducing a hydrogen atom or an unreactive saturated group into the side chains of the prepolymer as indicated in above general formula I to thereby obtain a cured product which has uniform crosslink density and is thus improved in the resistance to the cracking caused by thermal impact.

Among prepolymers which are essential components of the flame-retardant resin composition according to the present invention, those represented by the general formula I include ethers and esters of poly(p-hydroxybromostyrene) are preferred.

The unreactive saturated group $R_1$ of the general formula I includes alkyl ether and alkanoyl ester groups and particular examples thereof include methoxy, ethoxy, propoxy, isobutoxy, ethanoyloxy, propanoyloxy, isopropanoyloxy, epoxypropanoyloxy and epoxyisopropanoyloxy groups.

The reactive unsaturated group $R_2$ includes alkenyl ether and alkenoyl ester groups and particular examples thereof include vinyloxy, isopropenyloxy, isobutenyloxy, allyloxy, acryloyloxy, methacryloyloxy, epoxyacryloyloxy and epoxymethacryloyloxy groups.

The copolymerization ratio of $R_1$ and $R_2$ are each in the range of 0.3 to 0.7. Further by forming into a random copolymer, the prepolymer having reactive groups at proper side chains is obtained and a flame-retardant cured product having a uniform crosslink density is obtained.

The flame-retardant resin composition according to the present invention may contain, in addition to the above prepolymer, 1,2-polybutadiene derivative having unsaturated groups at its side chains.

The above 1,2-polybutadiene derivative having an unsaturated group at its side chains includes various derivative prepolymers of such polymers and copolymers as containing 1,2-polybutadiene units as a base component and having vinyl groups at its side chains, for example, 1.2-polybutadiene homoprepolymer, cyclized 1,2-polybutadiene, epoxy-modified 1,2-polybutadiene, epoxy-terminated 1,2-polybutadiene, 1,2-polybutadiene glycol, 1,2-polybutadienecarboxylic acid, urethane-modified 1,2-polybutadiene, maleicnized 1,2-polybutadiene, terminally acrylic-modified 1,2-polybutadiene and terminally ester-modified 1,2-polybutadiene.

The polymerization mixing ratio by weight of these two components is selected between 80:20 and 20:80. If the amount of the former, i.e., a compound of the general formula I is larger than the upper limit, the resulting composition is problematic in electrical characteristics and moldability, while if the amount of the latter is larger than the upper limit, the composition is problematic in flame retardance and mechanical strength. The ratio by weight is preferably between 60:40 and 40:60.

Now the production of the laminate according to the present invention will be described. A flame-retardant resin composition as described above is dissolved in an organic solvent with a predetermined concentration to prepare a varnish. In this step, the dissolution may be carried out under heating to a suitable temperature to accelerate it. Examples of the organic solvent include toluene, xylene, acetone, methyl ethyl ketone, methyl isobutyl ketone, ethanol, methanol, 3-methoxypropanol, 2-methoxyethanol, N,N-dimethylformamide, N-methylpyrrolidone, dimethyl sulfoxide, trichloroethylene and 1,1,2-trichloroethane, though the organic solvent may be any one, as far as the above polymer component is homogeneously dissolved therein or is homogeneously mixed therewith.

A radical polymerization initiator is added to the prepared varnish to obtain an impregnating varnish. Representative examples of the radical polymerization initiator include benzoyl peroxide, dicumyl peroxide, methyl ethyl ketone peroxide, t-butyl perbenzoate, t-butyl peroxylaurate, di-t-butyl peroxyphthalate, dibenzyl peroxide, 2,5-dimethyl-2,5-di(t-butylperoxy)hexyne-3, cumene hydroperoxide, t-butyl hydroperoxide and 2,5-dimethylhexane 2,5-dihydroperoxide. Such a radical polymerization initiator is added in an amount of 0.1 to 10 parts by weight per 100 parts by weight of the resin composition.

Further, if necessary, a reaction regulator such as radical polymerization accelerator or inhibitor or a curing agent or accelerator for epoxy compounds or an additive such as pigment may be added.

A base material or a substrate in the form of sheet is impregnated with the obtained impregnating varnish and dried at room temperature to 170° C. to obtain a tack free prepreg. The drying temperature varies depending upon the solvent or the radical polymerization initiator or the like used.

A required number of the prepregs thus prepared are piled up and cured under a pressure of 1 to 100 kgf/cm$^2$ at 100° to 250° C. to obtain a laminate.

The base material in the form of sheet to be used includes nearly all ordinary ones which are used in the production of a laminate. Particular examples thereof include inorganic fibers such as various glass fibers comprising $SiO_2$, $Al_2O_3$ and the like, such as E-, C-, A-, T-, D- or Q-glass, and organic fibers such as aramide fiber, PTFE(polytetrafluoroethylene) fiber and polyamide fiber.

PREFERRED EMBODIMENTS OF THE INVENTION

The present invention will be further described in more detail by referring to the following Examples, though it is not limited to them.

EXAMPLE 1

Poly(p-hydroxybromostyrene) (prepolymer represented by the formula I wherein m=n÷1.5; mfd. by Maruzen Oil Co., Ltd.) was esterified with isopropanoyl chloride and methacryloyloxy chloride successively to obtain a prepolymer containing both isopropanoyloxy and methacryloyloxy groups at a ratio of 5:5. This prepolymer was dissolved in methyl isobutyl ketone by heating at 80° C. for 30 minutes to obtain a varnish having a solid content of 40% by weight. 2 parts by weight of 2,5-dimethyl-2,5-di(t-butylperoxy)hexyne-3(Perhexyne 25 B mfd . By Nippon Oils and Fats Co., Ltd.) was added to 100 parts by weight of the varnish solid content to prepare an impregnating varnish. A glass cloth (E-glass mfd. by Nitto Boseki Co., Ltd.; thickness: 0.05 mm) was impregnated with the impregnating varnish and dried in a constant-temperature air of 100° to 120° C. for 20 minutes to obtain a prepreg. Twenty prepregs thus prepared were piled up and heated under a pressure of 30 kgf/cm$^2$ at 130° C. for 30 minutes. The resulting prepregs were heated to 220° C. and kept at the same temperature in a press for 2 hours to carry out the curing and adhesion thereof. Thus, a laminate was obtained.

EXAMPLE 2

The same prepolymer as that used in Example 1 and an epoxy-modified polybutadiene (mfd. by Nippon Soda Co., Ltd.) were dissolved in methyl isobutyl ketone in a weight ratio of 50:50 by heating to 80° C. for 30 minutes to obtain a varnish having a solid content of 40% by weight. 2 parts by weight of 2,5-dimethyl-2,5-di(t-butylperoxy) hexane-3 (Perhexyne 25 B mfd. by Nippon Oils and Fats Co., Ltd.) as a radical polymerization initiator and the same equivalent amount as the epoxy equivalent amount of benzoguanamine (having 4 active hydrogen atoms, mfd. by Tokyo Kasei) as a curing agent for the epoxy compound were added to 100 parts by weight of the varnish solid content to obtain an impregnating varnish. A laminate was prepared by the use of the impregnating varnish in a similar manner to that described in Example 1.

EXAMPLE 3

A copolymer comprising p-hydroxybromostyrene (corresponding to the unit of the formula I wherein $n \div 1.5$) and tetrabromostyrene (corresponding to the unit of the formula I wherein $m=4$) with a ratio of 1:1 was reacted with methacryloyl chloride to obtain a prepolymer containing hydrogen atoms and methacryloyloxy groups at its side chains with a ratio of 5:5. A laminate was prepared by using this precopolymer and the same epoxy-modified polybutadiene as that used in Example 2 in a similar manner to that described in Example 2.

EXAMPLE 4

A varnish was prepared by using the same prepolymer and polybutadiene as those used in Example 2 and diacrylate of a reaction product between tetrabromobisphenol A and ethylene oxide ( mfd. by Dai-Ichi Kogyo Seiyaku Co., Ltd.) which is a component for improving the fluidity in molding at a weight ratio of 35:50:15 in a similar manner to that described in Example 1. A laminate was prepared by the use of this varnish in a similar manner to that described in Example 1.

EXAMPLE 5

Same poly(p-hydroxybromostyrene)(mfd. by Maruzen Oil Co., Ltd.) as that used in Example 1 was etherified with propyl chloride and allyl chloride successively to obtain a precopolymer containing propoxy group and allyloxy group at its side chains with a ratio of 4:6. This prepolymer and partially cyclized 1,2-polybutadiene were dissolved in xylene at a weight ratio of 60:40 by heating to 80° C. for 30 minutes to obtain a varnish having a solid content of 40% by weight. A laminate was prepared by using this varnish in a similar manner to that described in Example 1.

COMPARATIVE EXAMPLE 1

Same poly(p-hydroxybromostyrene) (mfd. by Maruzen Oil Co., Ltd.) as that used in Example 1 was esterified with methacryloyl chloride alone to convert all of its side chains into methacryloyloxy groups. A laminate was prepared by using the resulting prepolymer and the same epoxy-modified polybutadiene as that used in Example 2 in a similar manner to that described in Example 1.

The characteristics of the laminates obtained above are shown in Table 1. The resistance of the laminate to the cracking caused by thermal impact was determined by subjecting the laminate to a heat shock test including floating on a solder of 288° C. for one minute and to a heat cycle test comprising heating at 125° C. for 20 minutes and cooling at $-65°$ C. for 20 minutes to examine crack generation in the laminate.

TABLE 1

|  | Example | | | | | Comp. |
|---|---|---|---|---|---|---|
|  | 1 | 2 | 3 | 4 | 5 | Ex. 1 |
| Dielectric constant (1 MHz) | 3.6 | 3.4 | 3.3 | 3.5 | 3.3 | 3.4 |
| Thermal expansion (°C.$^{-1}$) | $8 \times 10^{-5}$ | $8 \times 10^{-5}$ | $9 \times 10^{-5}$ | $8 \times 10^{-5}$ | $8 \times 10^{-5}$ | $6 \times 10^{-5}$ |
| Thermal decomposition-initiating temperature (°C.) | 340 | 320 | 300 | 310 | 310 | 320 |
| Flame retardance UL Standards | 94-V-O | 94-V-O | 94-V-O | 94-V-O | 94-V-O | 94-V-O |
| Solder test 288° C., 1 min. | no crack | no crack | no crack | no crack | no crack | crack |
| Heat cycle test cycles before crack generation | >50 | >50 | >50 | >50 | 40 | <10 |

It is understood from the results shown in Table 1 that the resistance of a laminate to the cracking by thermal impact is remarkably improved by using the copolymerizable prepolymer according to the present invention. Additionally, the laminate prepared by using the prepolymer is also excellent in heat resistance and electrical characteristics.

A laminate material prepared by using the flame-retardant resin composition according to the present invention has a dielectric constant about 3.5 which is lower than that of the polyimide according to the prior art, i.e., 4.7. Therefore, the application of the laminate material to a multi-layer printed wiring board brings about remarkable increase of signal transmission speed. As compared with the polybutadiene as proposed the laminate material of the present invention employing a flame-retardant high-molecular weight prepolymer of a crosslinking type exhibits excellent characteristics such as in thermal expansion which is a criterion of dimensional stability and in thermal decomposition-initiating temperature which is a criterion of heat resistance. According to the present invention, the prepolymer is formed into a copolymer composition wherein the parts of the side chains contain hydrogen atoms or saturated groups without rendering all of the side chains of reactive unsaturated groups, therefore, the prepolymer is cured without causing locally heterogeneous crosslinking reaction during curing reaction to give a cured product having a uniform crosslink density and exhibiting less concentration of the residual stress during curing reaction. Thus, the laminate prepared by the use of the prepolymer is remarkably improved in the resistance to the crack caused by thermal impact such as heat shock or heat cycle.

We claim:

1. A flame-retardant resin composition containing a prepolymer represented by the general formula:

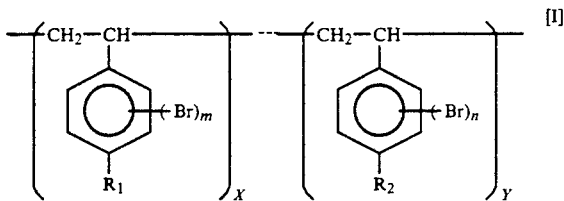

wherein $R_1$ stands for a hydrogen atom, an alkyl ether group (excluding an alkyl halide ether group) or an alkanoyl ester group; $R_2$ stands for an alkenoyl ester group; m and n each stand for a positive number of 1 to 4 and X and Y are each a copolymerization ratio and are in the range of 0.3 to 0.7, with the proviso with the sum total of X and Y is 1.

2. A flame-retardant resin composition as set forth in claim 1, wherein $R_1$ is methoxy, ethoxy, propoxy, isobutoxy, ethanoyloxy, propanoyloxy, isopropanoyloxy, epoxypropanoyloxy or epoxyisopropanoyloxy group.

3. A flame-retardant resin composition as set forth in claim 1, wherein $R_2$ is acryloyloxy, methacryloyloxy, epoxyacryloyloxy or epoxymethacryloyloxy group.

4. A flame-retardant resin composition as set forth in claim 1, wherein said prepolymer is poly(p-hydroxybromostyrene) with m and n both being about 1.5 containing isopropanoyloxy and methacryloyloxy groups at its side chains with a ratio of 5:5.

* * * * *